United States Patent
Balakrishnan

(10) Patent No.: US 7,253,059 B2
(45) Date of Patent: *Aug. 7, 2007

(54) METHOD OF FORMING AN INTEGRATED CIRCUIT WITH MULTI-LENGTH POWER TRANSISTOR SEGMENTS

(75) Inventor: Balu Balakrishnan, Saratoga, CA (US)

(73) Assignee: Power Integrations, Inc., San Jose, CA (US)

( * ) Notice: Subject to any disclaimer, the term of this patent is extended or adjusted under 35 U.S.C. 154(b) by 33 days.

This patent is subject to a terminal disclaimer.

(21) Appl. No.: 11/323,659

(22) Filed: Dec. 30, 2005

(65) Prior Publication Data

US 2006/0110861 A1    May 25, 2006

Related U.S. Application Data

(62) Division of application No. 10/974,176, filed on Oct. 26, 2004, now abandoned.

(51) Int. Cl.
*H01L 21/8232* (2006.01)

(52) U.S. Cl. .............. 438/275; 257/401; 257/368; 257/E29.011; 257/206

(58) Field of Classification Search .............. 327/427, 327/365; 257/500, 401; 438/275
See application file for complete search history.

(56) References Cited

U.S. PATENT DOCUMENTS

| | | | | |
|---|---|---|---|---|
| 4,808,861 A | * | 2/1989 | Ehni | ........................... 327/389 |
| 5,495,123 A | * | 2/1996 | Canclini | ..................... 257/500 |
| 5,723,875 A | * | 3/1998 | Abe et al. | ..................... 257/48 |
| 5,729,032 A | * | 3/1998 | Tomomatsu et al. | ........ 257/139 |
| 5,748,025 A | | 5/1998 | Ng et al. | |
| 6,316,807 B1 | | 11/2001 | Fujishima et al. | |
| 6,552,597 B1 | | 4/2003 | Disney | |
| 6,586,283 B2 | | 7/2003 | Corcoran et al. | |
| 6,734,714 B2 | * | 5/2004 | Disney | ..................... 327/427 |
| 6,867,465 B2 | * | 3/2005 | Dono | ......................... 257/401 |
| 7,135,748 B2 | | 11/2006 | Balakrishnan | |
| 2002/0024375 A1 | * | 2/2002 | Asano et al. | ............... 327/365 |
| 2004/0004497 A1 | | 1/2004 | Shang et al. | |
| 2004/0051395 A1 | * | 3/2004 | Brindle et al. | ............. 307/115 |
| 2004/0245546 A1 | * | 12/2004 | Lin et al. | .................... 257/173 |
| 2005/0051853 A1 | * | 3/2005 | Baum et al. | ................ 257/401 |
| 2005/0225362 A1 | | 10/2005 | Halamik et al. | |

* cited by examiner

*Primary Examiner*—Jerome Jackson
*Assistant Examiner*—Paul Budd
(74) *Attorney, Agent, or Firm*—The Law Offices of Bradley J. Bereznak

(57) ABSTRACT

A monolithic power integrated circuit fabricated on a semiconductor die includes a control circuit and a first output high voltage field-effect transistor (HVFET) having source and drain segments substantially equal to a first length. A second output HVFET has source and drain segments substantially equal to a second length. At least one of the first and second output HVFETs is coupled to the control circuit. It is emphasized that this abstract is provided to comply with the rules requiring an abstract that will allow a searcher or other reader to quickly ascertain the subject matter of the technical disclosure. It is submitted with the understanding that it will not be used to interpret or limit the scope or meaning of the claims.

6 Claims, 3 Drawing Sheets

METHOD OF FORMING AN INTEGRATED CIRCUIT WITH MULTI-LENGTH POWER TRANSISTOR SEGMENTS

This application is a division of application Ser. No. 10/974,176, filed Oct. 26, 2004, now abandoned entitled, "INTEGRATED CIRCUIT WITH A MULTI-LENGTH POWER TRANSISTOR SEGMENTS", which is assigned to the assignee of the present application.

FIELD OF THE INVENTION

The present invention relates generally to the field of semiconductor devices; more specifically, to monolithic power integrated circuits and to methods of manufacturing power devices.

BACKGROUND OF THE INVENTION

Power integrated circuits (PICs) find application in an increasingly wide variety of electronic devices. Typically,. PICs comprise one or more high-voltage field effect transistors (HVFETs) having a device structure such as those disclosed in U.S. Pat. No. 6,207,994 ("the '994 patent"), which is herein incorporated by reference. Each of the devices disclosed in the '994 patent has a source region and a drain region separated by an intermediate region. A gate structure is disposed over a thin oxide layer over the metal-oxide-semiconductor (MOS) channel of the device. In the on state, a voltage is applied to the gate to cause a conduction channel to form between the source and drain regions, thereby allowing current to flow through the device. In the off state, the voltage on the gate is sufficiently low such that no conduction channel is formed in the substrate, and thus no current flow occurs. In this condition, high voltage is supported between the drain and source regions.

Most power integrated circuits (ICs) contain one or more output HVFETs that control current flow through one or more external loads. By way of example, FIG. 7 of the '994 patent discloses an HVFET structure with interdigitated source and drain regions that is commonly utilized as an output transistor in many types of power devices. In the design of a particular PIC, these elongated source/drain segments may be replicated to increase the current handling capability of the power device.

FIG. 1 shows a typical prior art PIC fabricated on a semiconductor die 10 having an aspect ratio defined as the ratio of the length (L) to the width (W). Included on semiconductor die 10 is a control circuit 11 that is utilized to control on/off switching of an output HVFET 12. In PIC designs, it is customary to utilize a single standardized control circuit design coupled to a variety of HVFET layouts of differing sizes (e.g., number of segments) to create a family of devices with similar functionality, but with differing current handling capability. For example a family of PICs, each with differing current handling capabilities, may be created by increasing the number of parallel segments of HVFET 12. According to this traditional approach, PICs with larger current handling capability have a larger width (W) to accommodate more source/drain segments, but the same length (L). In other words, in prior art PIC designs, the length of the output HVFET 12 is substantially constant, and equal to the length of control circuit 11. PIC devices with more current handling capability have more segments added in parallel, which increases the width of the semiconductor die.

To achieve maximum utilization of the package space that houses semiconductor die 10, control circuit 11 is usually designed with a length that is much larger than its width. In a typical PIC product family the smallest device is designed to be long and narrow (i.e., large aspect ratio), with larger devices having an increased width dimension due to the added number of HVFET segments (i.e., smaller aspect ratio). That is, the aspect ratio of larger devices decreases as more segments are added.

Aspect ratio is a critical parameter in the design of a monolithic PIC. A PIC fabricated on a semiconductor die having a very large or very small aspect ratio often suffers from mechanical stress caused by the molding compound used to bond the die to the package. This stress can adversely change the electrical properties of the PIC circuitry. A semiconductor die having a length that is substantially equal to its width (i.e., aspect ratio=1) minimizes stress and permits more efficient wire routing of the control circuit. The difficulty, however, is that HVFET 12 is required to have elongated segments in order to achieve a specific current handling capability. The package also has maximum cavity size. Thus, while it is desirable to manufacture a PIC on a semiconductor die having a substantially square shape, the need to provide a product family with a range of current handling capabilities which fits within a package cavity size has constrained the dimensions of control circuit 11 and semiconductor die 10.

The solution of the prior art has been to provide a control circuit that has a relatively narrow width and a much larger length that is substantially equal to the maximum package cavity size. For example, in FIG. 1 the length of control circuit 11 is about four times its width. However, this causes inefficiencies in control circuit wiring. Another significant shortcoming of this prior art approach is that PIC devices with small HVFETs (fewer segments) suffer from package stress problems caused by high semiconductor die aspect ratio.

Thus, there is an unsatisfied need for an improved monolithic PIC design that overcomes the problems of poor control circuit area efficiency and high PIC aspect ratio.

BRIEF DESCRIPTION OF THE DRAWINGS

The present invention will be understood more fully from the detailed description that follows and from the accompanying drawings, which however, should not be taken to limit the invention to the specific embodiments shown, but are for explanation and understanding only.

DETAILED DESCRIPTION

An improved monolithic power integrated circuit is described. In the following description, numerous specific details are set forth, such as device types, dimensions, circuit configurations, etc., in order to provide a thorough understanding of the present invention. However, persons having ordinary skill in the semiconductor arts will appreciate that these specific details may not be needed to practice the present invention.

Figure 1:
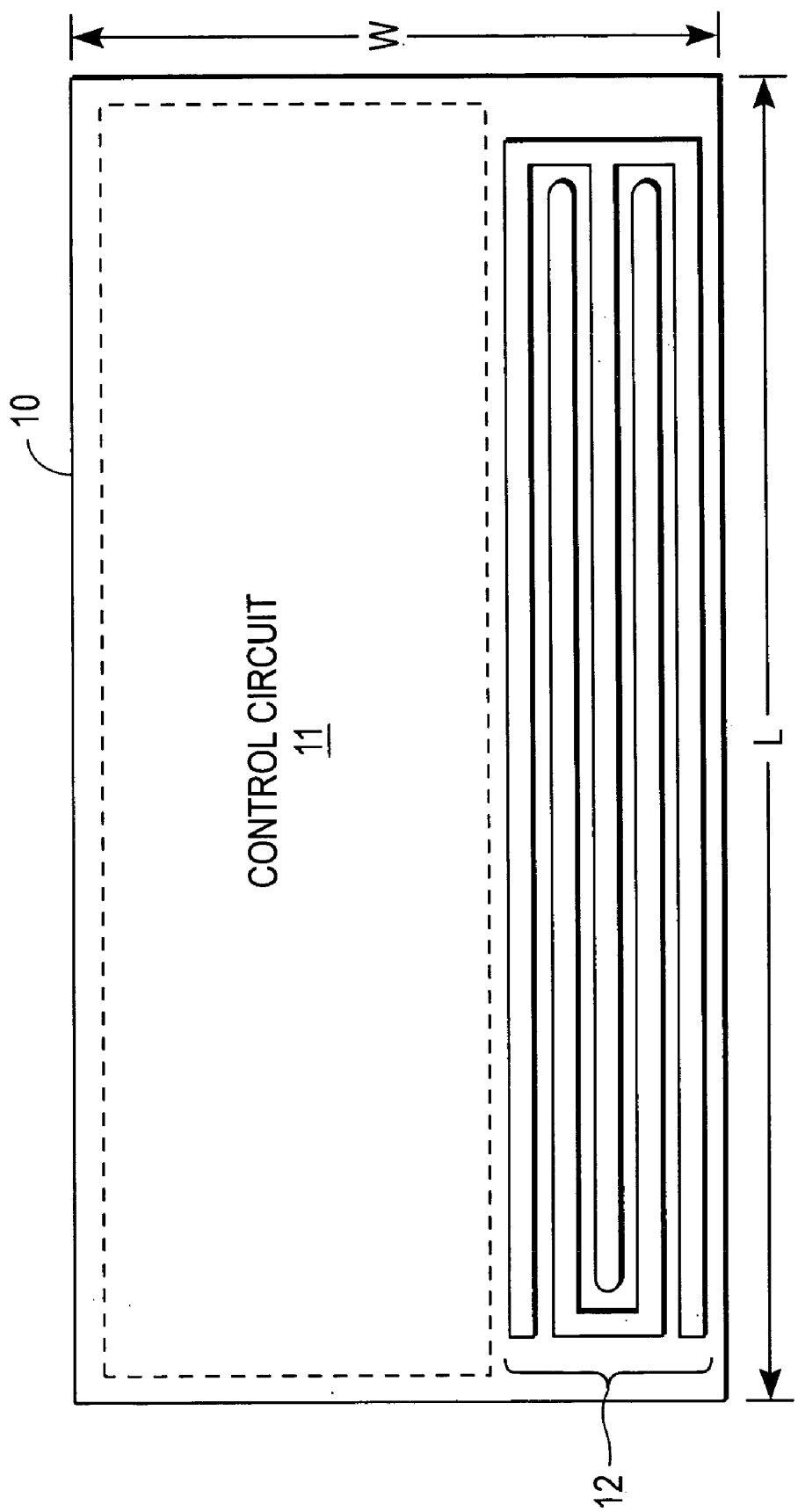
FIG. 1 shows a circuit layout of a prior art monolithic power integrated circuit.
Figure 2:
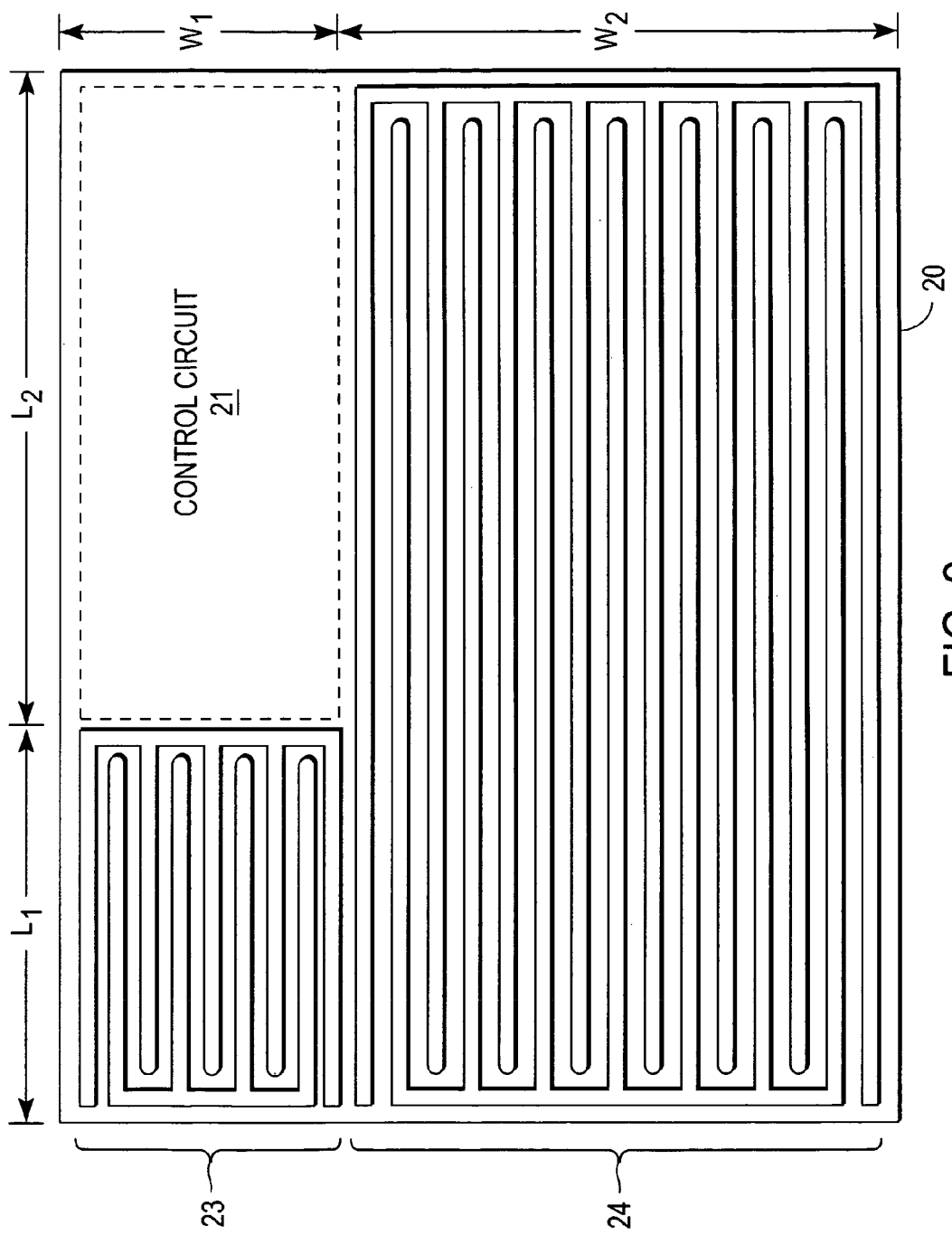
FIG. 2 is circuit layout illustrating a monolithic power integrated circuit according to one embodiment of the present invention.

FIG. 2 illustrates a circuit layout of a monolithic PIC according to one embodiment of the present invention. The PIC of FIG. 2 is fabricated on a semiconductor die 20 and includes a first output HVFET 23 having a set of relatively short interdigitated source/drain segments, and a second output HVFET 24 having a set of relatively long interdigitated source/drain segments. The segments of HVFETs 23 & 24 are placed on die 20 in a manner that optimizes the layout of control circuit 21. The arrangement of HVFETs 23 & 24 also improves the layout of the complete PIC such that die 20 has a lower aspect ratio as compared to prior art devices, even for implementations with low current handling capability.

As can be seen, output HVFET 23, with the short segments, is located on die 20 adjacent the short, lateral side of control circuit 21. Control circuit 21 and HVFET 23 both have substantially the same width ($W_1$). In this embodiment, HVFET 23 has a length ($L_1$) that is less than the length ($L_2$) of control circuit 11. The total length (L) of semiconductor die 20 is approximately equal to the sum of the lengths of HVFET 23 and control circuit 21 ($L \simeq L_1 + L_2$).

In the embodiment of FIG. 2, output HVFET 24 is shown located on die 20 adjacent the long, bottom side of control circuit 21, and also extending beneath the length of HVFET 23. The length of the segments of output HVFET 24 is substantially equal to the length ($L_2$) of control circuit 21 plus the length ($L_1$) of the segments of output HVFET 23. In other words, the short HVFET segments are placed alongside the short side of control circuit 11 such that the combined control circuit and short HVFET segment length is substantially the same as the length of the long HVFET segments of transistor 24.

The total width (W) of semiconductor die 20 is approximately equal to the sum of the widths of control circuit 21 and HVFET 24 ($W \simeq W_1 + W_2$). To manufacture a PIC device with increased current handling capability, more long segments are added in parallel to HVFET 24, which has the effect of increasing the $W_2$ dimension and lowering the aspect ratio of semiconductor die 20.

Practitioners in the integrated circuit and semiconductor fabrication arts will appreciate that the embodiment shown in FIG. 2 permits control circuit 21 to have a layout with a smaller aspect ratio than prior art designs. In the implementation shown in FIG. 2, the length ($L_2$) of control circuit 21 is about three times its width ($W_1$). Furthermore, the novel use and placement of multiple HVFETs having different segment lengths results in an aspect ratio closer to 1.0 for the complete PIC. This means that a family of PIC devices, each with different current handling capability, may be manufactured on a semiconductor die 20, each having an aspect ratio closer to 1.0. For the embodiment shown in FIG. 2, the aspect ratio of die 20 is about 1.6.

With continuing reference to FIG. 2, a PIC device having a relatively small current handling capability may be realized by connecting control circuit 21 to HVFET 23, but not to HVFET 24. A PIC device having increased current handling capability may be implemented by connecting control circuit 21 to both HVFET 23 and HVFET 24, or just to HVFET 24 and not HVFET 23. PIC devices that provide even larger current handing capability may be realized by increasing the number of long segment of HVFET 24 during the layout and manufacturing of semiconductor die 20. In each case, the dimensions of control circuit 21 remain the same. In accordance with the present invention, a complete family of PIC devices having a wide range of current handling capabilities may be implemented on a semiconductor die having an aspect ratio within a range of 0.5 to 2.0.

It should be understood that even though the embodiment of FIG. 2 illustrates two HVFETs with different length segments, there is no restriction on the number of HVFETs that may be included on die 20. That is, more than two HVFETs having different length segments may be included on die 20.

For example, a PIC with four output HVFETs may be implemented in which two additional HVFETs are located side-by-side on die 20 above or below HVFET 24. The two additional output HVFETs may have a combined segment length that is approximately equal to the sum of the lengths of HVFET 23 and control circuit 21 ($L \simeq L_1 + L_2$). In such as case, the segment lengths of the two additional HVFETS may have an intermediate length that is longer than that of the short segments of HVFET 23, yet shorter than the length of the long segments of HVFET 24. These additional HVFETs with intermediate length segments may be selectively coupled to control circuit 21 to implement a PIC device providing an intermediate range of output current capacity.

Figure 3:
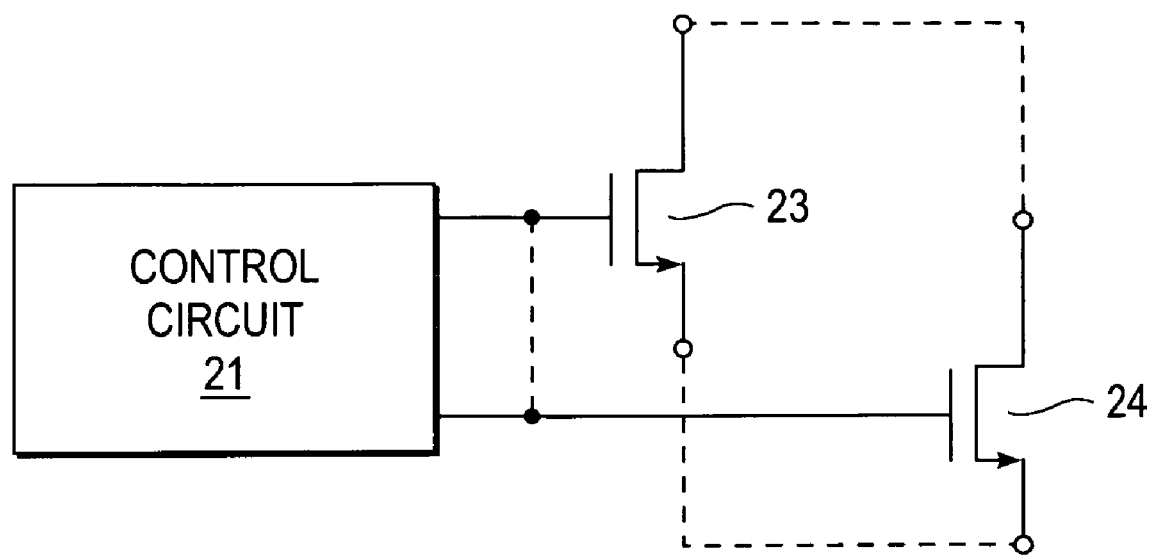
FIG. 3 is a circuit schematic diagram that corresponds to the monolithic power integrated circuit shown in FIG. 2.

FIG. 3 is a circuit schematic diagram that corresponds to the monolithic power integrated circuit shown in FIG. 2. As explained previously, control circuit 21 may be selectively coupled to output HVFET 23 or to output HVFET 24, or to both HVFETs 23 & 24. This latter case is depicted by the dashed line showing a common connection to each of the three terminals (i.e., source, drain, and gate) of the respective HVFETs. Alternatively, the HVFETs may have only one or two terminals coupled together (i.e., only the source terminals).

Persons of ordinary skill in the integrated circuit and semiconductor arts will appreciate that selective coupling between control circuit 21 and one or both of the output HVFETs 23 & 24 may be achieved utilizing a variety of conventional techniques and circuits. For example, an optional metal connection may be implemented during the layout and fabrication of the PIC. Alternatively, an ordinary on-chip switching circuit may be utilized for selectively coupling one or more of the output HVFETs to control circuit 21. This switching circuit may be incorporated into the layout of control circuit 21 and may comprise one or more transistor switching devices (e.g., transmission gates).

Although the present invention has been described in conjunction with specific embodiments, those of ordinary skill in the arts will appreciate that numerous modifications and alterations are well within the scope of the present invention. Accordingly, the specification and drawings are to be regarded in an illustrative rather than a restrictive sense.

I claim:

1. A method of manufacturing a monolithic power integrated circuit (PIC) on a semiconductor die, the method comprising:

locating a control circuit in a first area of the semiconductor die, the control circuit having a length that extends along a first side and a width that extends along a second side;

locating a first output high voltage field-effect transistors (HVFET) adjacent the second side of the control circuit, the first output HVFET having a width substantially equal to the width of the control circuit;

locating a second output HVFET adjacent the first side of the control circuit, the second output HVFET having a length substantially equal to the length of the control circuit plus a length of the first output HVFET; and coupling the control circuit to at least one of the first or second output HVFETs.

2. The method of claim 1 wherein the first and second output HVFETs each comprise interdigitated segments, the interdigitated segments of the second output HVFET being substantially longer than the interdigitated segments of the first output HVFET.

3. The method of claim 1 wherein the semiconductor die has an aspect ratio within a range of 0.5 to 2.0.

4. A method of manufacturing a monolithic power integrated circuit (PIC) on a semiconductor die, the method comprising:

locating a control circuit in a first area of the semiconductor die, the control circuit having a length that extends along a first side and a width that extends along a second side;

locating a first output high voltage field-effect translator (HVFET) adjacent the second side of the control circuit, the first output HVFET having a width substantially equal to the width of the control circuit;

locating a second output HVFET adjacent the first side of the control circuit, the second output HVFET having a length substantially equal to the length of the control circuit plus a length of the first output HVFET; and coupling the control circuit to the first output HVFET such that the PIC has a first current handling capacity, or, alternatively, coupling the control circuit to the second output HVFET such that the PIC has a second current handling capacity;

wherein the second current handling capacity is substantially greater than the first current handling capacity.

5. The method of claim 4 wherein the first and second output HVFETs each comprise interdigitated segments, the interdigitated segments of the second output HVFET being substantially longer than the interdigitated segments of the first output HVFET.

6. The method of claim 4 wherein the semiconductor die has an aspect ratio within a range of 0.5 to 2.0.

* * * * *